United States Patent
Higuchi

(10) Patent No.: US 9,722,554 B2
(45) Date of Patent: Aug. 1, 2017

(54) DIFFERENTIAL AMPLIFIER AND DISPLAY DRIVER INCLUDING THE SAME

(71) Applicant: LAPIS Semiconductor Co., Ltd., Yokohama (JP)

(72) Inventor: Koji Higuchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 165 days.

(21) Appl. No.: 14/845,264

(22) Filed: Sep. 3, 2015

(65) Prior Publication Data

US 2016/0071453 A1 Mar. 10, 2016

(30) Foreign Application Priority Data

Sep. 8, 2014 (JP) .................... 2014-182026

(51) Int. Cl.
*H03F 3/393* (2006.01)
*H03F 3/45* (2006.01)
*G09G 3/20* (2006.01)

(52) U.S. Cl.
CPC ......... *H03F 3/393* (2013.01); *H03F 3/45183* (2013.01); *H03F 3/45775* (2013.01); *G09G 3/20* (2013.01); *G09G 2310/0254* (2013.01); *G09G 2310/0291* (2013.01); *G09G 2320/0247* (2013.01); *G09G 2330/026* (2013.01); *H03F 2200/396* (2013.01); *H03F 2200/417* (2013.01); *H03F 2203/45212* (2013.01); *H03F 2203/45586* (2013.01); *H03F 2203/45588* (2013.01)

(58) Field of Classification Search
CPC ............... G09G 3/3614; G09G 3/3688; G09G 2310/0291; G09G 2310/027; H03F 3/45744; H03F 2203/45212; H03F 3/45968; H03F 3/45
USPC ............................ 330/352; 345/204, 96, 100
See application file for complete search history.

(56) References Cited

U.S. PATENT DOCUMENTS

| | | | |
|---|---|---|---|
| 6,331,846 B1 * | 12/2001 | Nakao .................. | G09G 3/3614 330/252 |
| 7,893,909 B2 * | 2/2011 | Sung .................... | G09G 3/3688 330/250 |
| 8,976,097 B2 * | 3/2015 | Lee ...................... | G09G 3/3614 345/89 |

FOREIGN PATENT DOCUMENTS

JP     H11-249623 A     9/1999

* cited by examiner

*Primary Examiner* — Koosha Sharifi-Tafreshi
(74) *Attorney, Agent, or Firm* — Rabin & Berdo, P.C.

(57) ABSTRACT

When the offsets of the first and second differential units have polarities different from each other, the first and second differential units are both set to a normal connection state, i.e., a state in which the input voltage is supplied to the first input terminal of each of the first and second differential units and the output voltage is supplied to the second input terminal of each of the first and second differential units. When the offsets of the first and second differential units have the same polarity, on the other hand, the first differential unit is set to the above normal connection state and the second differential unit is set to a chopping connection state in which the output voltage is supplied to the first input terminal and the input voltage is supplied to the second input terminal.

15 Claims, 10 Drawing Sheets

| SD1,SD2 | YA | YB |
|---|---|---|
| NORMAL | $V_1$ | OUT |
| OFFSET DETECTION | $V_1$ | $V_1$ |
| CHOPPING | OUT | $V_1$ |

| | SZ | SD1 | SD2 | F1 | F2 |
|---|---|---|---|---|---|
| OFS1 | SW-OFF | OFFSET DETECTION | NORMAL | | |
| OFS2 | SW-OFF | NORMAL | OFFSET DETECTION | | |
| OFSC | SW-ON | NORMAL | NORMAL | + | − |
| | | | | − | + |
| | | | | + | + |
| | | CHOPPING | | − | − |

[FIRST OFFSET CANCELATION MODE]

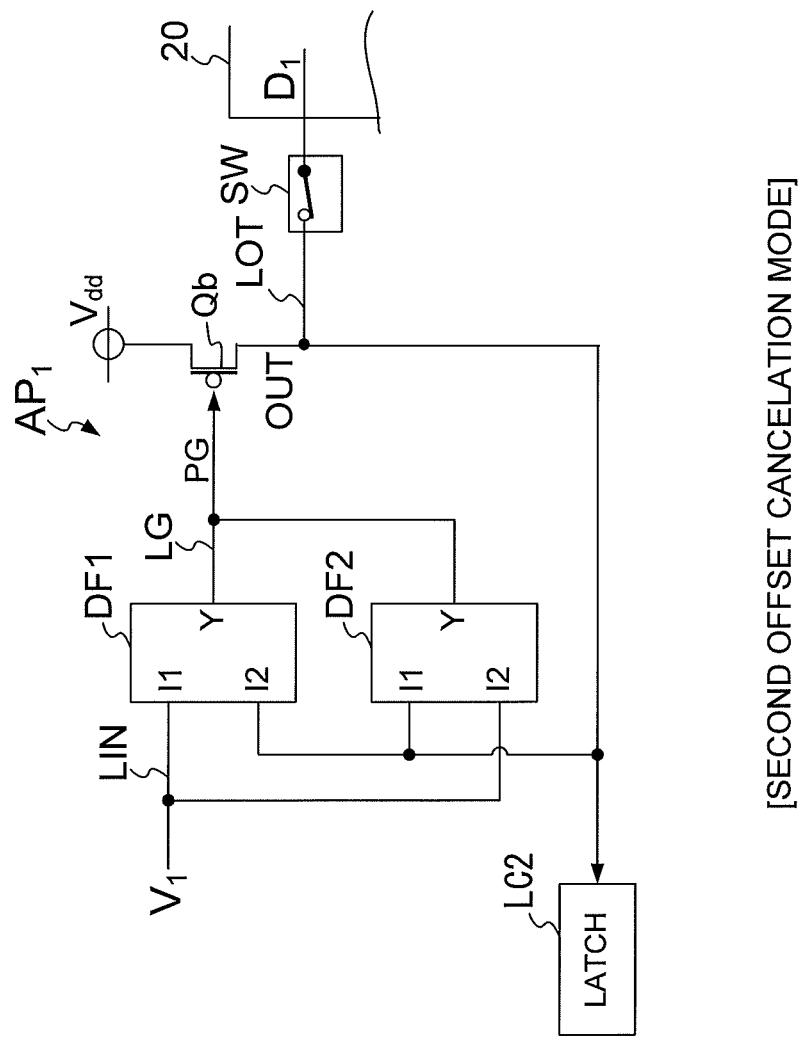

DIFFERENTIAL AMPLIFIER AND DISPLAY DRIVER INCLUDING THE SAME

BACKGROUND OF THE INVENTION

1. Field of the Invention

The present invention relates to a differential amplifier and a display driver including the differential amplifier.

2. Description of the Related Art

A display driver for driving a display panel, for example, a liquid crystal display panel, includes a plurality of amplifiers that apply gradation voltages having voltage values corresponding to luminance levels represented by an input video signal to respective data lines in the liquid crystal display panel.

As an amplifier for such a display driver, a differential amplifier (operational amplifier) has been proposed (see Japanese Patent Application Laid-open No. Hei. 11-249623, for example). In the differential amplifier, however, an offset is generated due to the influence of manufacturing variations, for example. Thus, when the differential amplifier is employed as an amplifier for a display driver, such an offset leads to a deterioration in a displayed image. In view of this, according to such a display driver, in supplying an input voltage to one of an inverting input terminal and a non-inverting input terminal of the differential amplifier and supplying an output voltage to the other terminal, the input terminals (the inverting input terminal and the non-inverting input terminal) to which the input voltage and the output voltage are supplied are interchanged with each other every predetermined period. This achieves reduction in average value of offsets contained in the output voltages on a long-term basis, i.e., offset cancelation.

According to the above offset cancelation method, however, an output voltage including a positive offset and an output voltage including a negative offset are alternately output as they are. Therefore, offsets may not be sufficiently averaged depending on its transition period. Thus, if a display panel is driven by the display driver employing the amplifiers having such an offset cancelation function, there is a risk of causing a deterioration in image quality such as flickering on a display screen.

SUMMARY OF THE INVENTION

In view of this, it is an object of the present invention to provide a differential amplifier capable of reducing an offset without causing a deterioration in image quality and a display driver including such a differential amplifier.

One aspect of the present invention is a differential amplifier for sending out an output voltage obtained by amplifying an input voltage via an output line, including: first and second differential units for respectively generating a voltage corresponding to a difference value between a voltage supplied to a first input terminal and a voltage supplied to a second input terminal on each of a first line; a drive line connected with both of the first line of the first differential unit and the first line of the second differential unit; an output transistor for generating the output voltage on the basis of a voltage on the drive line; a first connection switch for taking either one of a normal connection state in which the input voltage is supplied to the first input terminal of the first differential unit and the output voltage is supplied to the second input terminal of the first differential unit and an offset detection connection state in which the input voltage is supplied to the first and second input terminals of the first differential unit; a second connection switch for taking any one of a normal connection state in which the input voltage is supplied to the first input terminal of the second differential unit and the output voltage is supplied to the second input terminal of the second differential unit, an offset detection connection state in which the input voltage is supplied to the first and second input terminals of the second differential unit, and a chopping connection state in which the input voltage is supplied to the second input terminal of the second differential unit and the output voltage is supplied to the first input terminal of the second differential unit; and a control unit for performing first processing to determine the output voltage obtained when the first connection switch is set to the offset detection connection state as a first offset value, second processing to determine the output voltage obtained when the second connection switch is set to the offset detection connection state as a second offset value, and third processing to set the first and second connection switches to the normal connection state when the first and second offset values have polarities different from each other, and set the first connection switch to the normal connection state and set the second connection switch to the chopping connection state when the first and second offset values have the same polarity.

Another aspect of the present invention is a display driver including a plurality of differential amplifiers that apply output voltages obtained by separately amplifying gradation voltages corresponding to luminance levels of pixels based on a video data signal to data lines of a display device. Each of the differential amplifiers includes: first and second differential units for respectively generating a voltage corresponding to a difference value between a voltage supplied to a first input terminal and a voltage supplied to a second input terminal on each of a first line; a drive line connected with both of the first line of the first differential unit and the first line of the second differential unit; an output transistor for generating the output voltage on the basis of a voltage on the drive line; a first connection switch for taking either one of a normal connection state in which the gradation voltage is supplied to the first input terminal of the first differential unit and the output voltage is supplied to the second input terminal of the first differential unit and an offset detection connection state in which the gradation voltage is supplied to the first and second input terminals of the first differential unit; a second connection switch for taking any one of a normal connection state in which the gradation voltage is supplied to the first input terminal of the second differential unit and the output voltage is supplied to the second input terminal of the second differential unit, an offset detection connection state in which the gradation voltage is supplied to the first and second input terminals of the second differential unit, and a chopping connection state in which the gradation voltage is supplied to the second input terminal of the second differential unit and the output voltage is supplied to the first input terminal of the second differential unit; and a control unit for performing first processing to determine the output voltage obtained when the first connection switch is set to the offset detection connection state as a first offset value, second processing to determine the output voltage obtained when the second connection switch is set to the offset detection connection state as a second offset value, and third processing to set the first and second connection switches to the normal connection state when the first and second offset values have polarities different from each other, and set the first connection switch to the normal connection state and set the second connection switch to the chopping connection state when the first and second offset values have the same polarity.

Still another aspect of the present invention is a display driver including a plurality of differential amplifiers that apply output voltages obtained by separately amplifying gradation voltages corresponding to luminance levels of pixels based on a video data signal to data lines of a display device. Each of the differential amplifiers includes: first and second differential units for respectively generating a voltage corresponding to a difference value between a voltage supplied to a first input terminal and a voltage supplied to a second input terminal on each of a first line; a drive line connected with both of the first line of the first differential unit and the first line of the second differential unit; an output transistor for generating the output voltage on the basis of a voltage on the drive line; a first connection switch for taking either one of a normal connection state in which the gradation voltage is supplied to the first input terminal of the first differential unit and the output voltage is supplied to the second input terminal of the first differential unit and an offset detection connection state in which the gradation voltage is supplied to the first and second input terminals of the first differential unit; and a second connection switch for taking any one of a normal connection state in which the gradation voltage is supplied to the first input terminal of the second differential unit and the output voltage is supplied to the second input terminal of the second differential unit, an offset detection connection state in which the gradation voltage is supplied to the first and second input terminals of the second differential unit, and a chopping connection state in which the gradation voltage is supplied to the second input terminal of the second differential unit and the output voltage is supplied to the first input terminal of the second differential unit. The display driver further includes a control unit for performing, for each of the differential amplifiers, first processing to determine the output voltage obtained when the first connection switch is set to the offset detection connection state as a first offset value, second processing to determine the output voltage obtained when the second connection switch is set to the offset detection connection state as a second offset value, and third processing to set the first and second connection switches to the normal connection state when the first and second offset values have polarities different from each other, and set the first connection switch to the normal connection state and set the second connection switch to the chopping connection state when the first and second offset values have the same polarity.

According to the present invention, two differential units (the first differential unit and the second differential unit) are provided in the differential amplifier, and connection switching is made so that the offsets of the first and second differential units have polarities different from each other when the output of the first differential unit and the output of the second differential unit are added to achieve offset reduction.

More specifically, when the offsets of the first and second differential units have polarities different from each other, the first differential unit and the second differential unit are both set to the normal connection state, i.e., the state in which the input voltage is supplied to the first input terminal of each of the first and second differential units and the output voltage is supplied to the second input terminal of each of the first and second differential units. Consequently, part of the offsets is canceled out when the outputs of the first and second differential units are added together.

When the polarity of the offset of the first differential unit and the polarity of the offset of the second differential unit are the same, on the other hand, the first differential unit is set to the above normal connection state and the second differential unit is switched from the normal connection state to the chopping connection state. More specifically, connection switching is made for the second differential unit so that the output voltage is supplied to the first input terminal thereof and the input voltage is supplied to the second input terminal thereof. Consequently, the polarity of the offset of the second differential unit is inverted. Thus, part of the offsets is canceled out when the outputs of the first and second differential units are added together.

Thus, according to the present invention, the offset generated in the differential unit is never reflected in the output voltage as it is. Therefore, offset reduction can be achieved without causing a deterioration in image quality.

BRIEF DESCRIPTION OF THE DRAWINGS

FIG. 12 is an equivalent circuit diagram in a second offset cancelation mode in the amplifier $AP_1$.

DETAILED DESCRIPTION OF THE INVENTION

An embodiment of the present invention will now be described below in detail with reference to the drawings.

Figure 1:
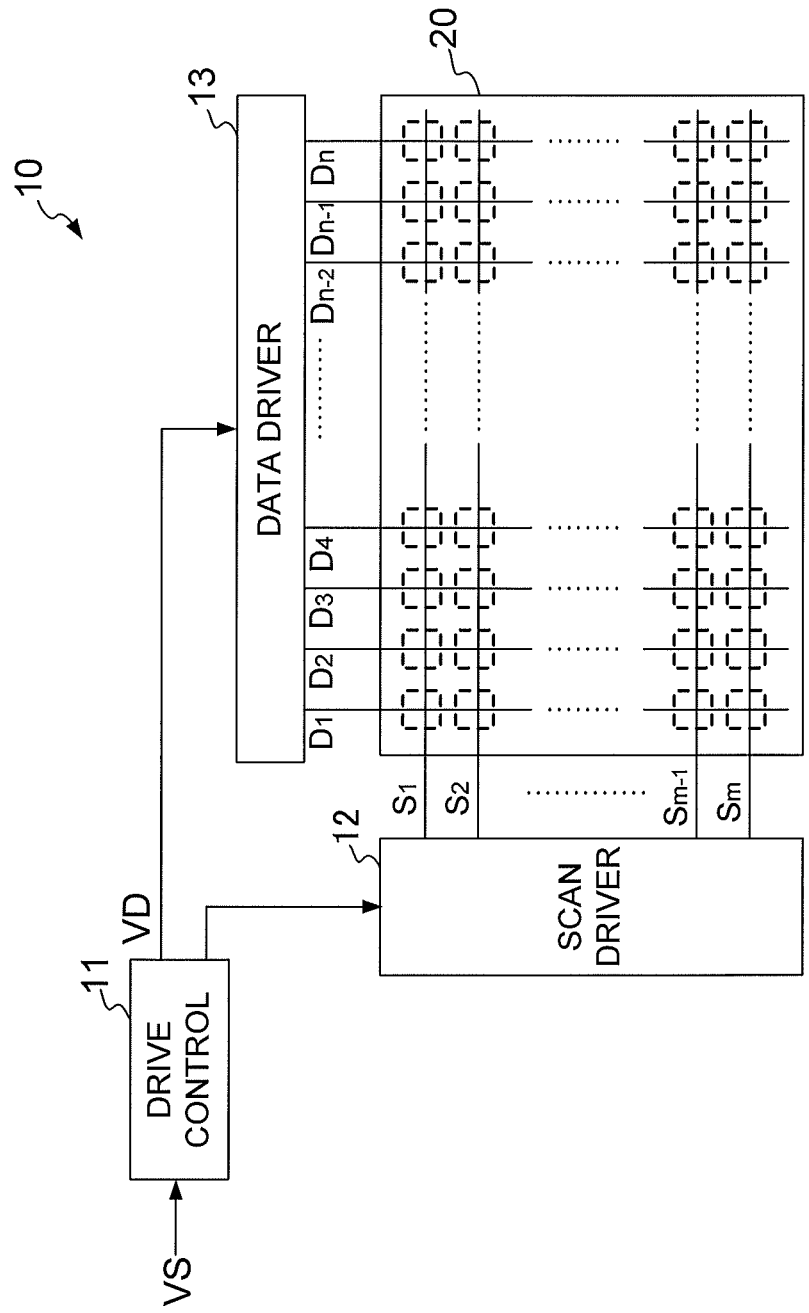
FIG. 1 is a block diagram illustrating a configuration of a display apparatus 10 having a data driver 13 including a differential amplifier according to the present invention.

FIG. 1 is a block diagram illustrating a configuration of a display apparatus 10 having a data driver 13 including a differential amplifier according to the present invention. The display apparatus 10 shown in FIG. 1 is configured by: a drive control unit 11; a scan driver 12; the data driver 13; and a display device 20 formed, for example, by a liquid crystal or organic EL display panel.

The display device 20 includes: m (m is a natural number larger than or equal to 2) horizontal scanning lines $S_1$ to $S_m$ each extending in a horizontal direction of a two-dimensional screen; and n (n is a natural number larger than or equal to 2) data lines $D_1$ to $D_n$, each extending in a vertical direction of the two-dimensional screen. A display cell constituting a pixel is formed at a region of each intersection between one horizontal scanning line and one data line, i.e., a region defined by a broken line in FIG. 1.

Figure 2:
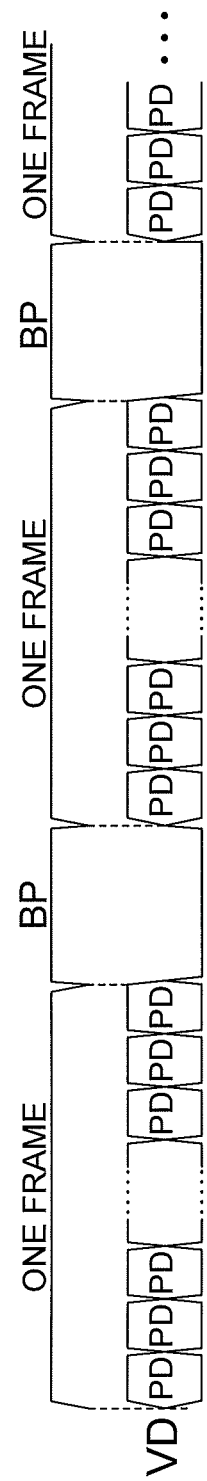
FIG. 2 is a time chart showing a format of a video data signal VD.

The drive control unit 11 generates, for each of pixels, a sequence of pixel data PD indicating the luminance level of the pixel by 8 bits, for example, on the basis of an input video signal VS. The drive control unit 11 supplies a video data signal VD containing the sequence of the pixel data PD to the data driver 13. In the video data signal VD, a blank period BP, corresponding to at least two or more horizontal scanning periods, is provided between a sequence of the pixel data PD for one frame and a sequence of the pixel data PD for the following one frame as shown in FIG. 2. Moreover, the drive control unit 11 detects a horizontal synchronizing signal from the input video signal VS and supplies the horizontal synchronizing signal to the scan driver 12.

The scan driver 12 generates a horizontal scan pulse in synchronization with the horizontal synchronizing signal supplied by the drive control unit 11. The scan driver 12 then applies the horizontal scan pulse to each of the scanning lines $S_1$ to $S_m$ in the display device 20 in a sequential and alternative manner.

Figure 3:
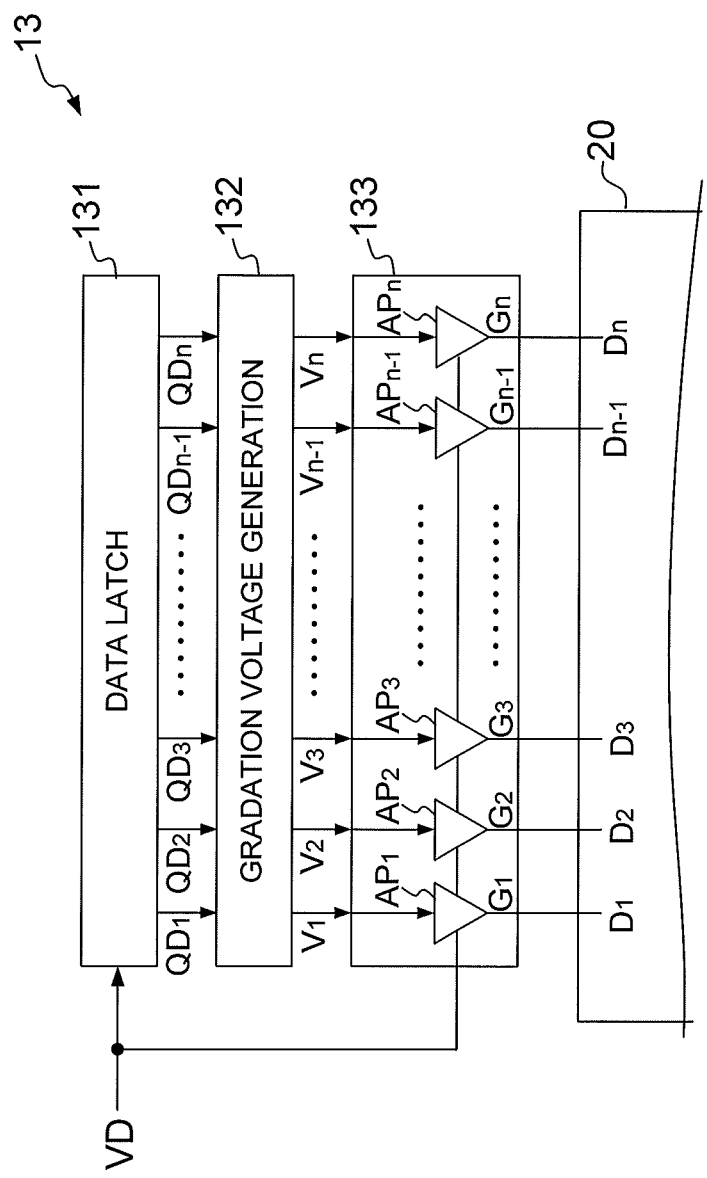
FIG. 3 is a block diagram illustrating an internal configuration of the data driver 13.

FIG. 3 is a block diagram illustrating an internal configuration of the data driver 13 functioning as a display driver. As shown in FIG. 3, the data driver 13 includes a data latch unit 131, a gradation voltage generating unit 132, and an output amplifier unit 133.

The data latch unit 131 sequentially takes in the sequence of the pixel data PD contained in the video data signal VD supplied from the drive control unit 11. At this time, every time the pixel data PD for one horizontal scanning line (n pieces) is taken in, the data latch unit 131 supplies the n pieces of pixel data PD to the gradation voltage generating unit 132 as pixel data $QD_1$ to $QD_n$. The gradation voltage generating unit 132 converts the pixel data $QD_1$ to $QD_n$ supplied from the data latch unit 131 into gradation voltages $V_1$ to $V_n$ having voltage values corresponding to respective luminance levels. The gradation voltage generating unit 132 supplies the gradation voltages $V_1$ to $V_n$ to the output amplifier unit 133.

The output amplifier unit 133 includes amplifiers $AP_1$ to $AP_n$ for separately amplifying the gradation voltages $V_1$ to $V_n$, respectively. The amplifiers $AP_1$ to $AP_n$ supply the separately amplified gradation voltages $V_1$ to $V_n$ to the data lines $D_1$ to $D_n$ in the display device 20 as pixel driving voltages $G_1$ to $G_n$, respectively. Note that the amplifiers $AP_1$ to $AP_n$ are differential amplifiers each having the same internal configuration.

A differential amplifier according to the present invention will now be described below with reference to the amplifier $AP_1$ from among the amplifiers $AP_1$ to $AP_n$.

Figure 4:
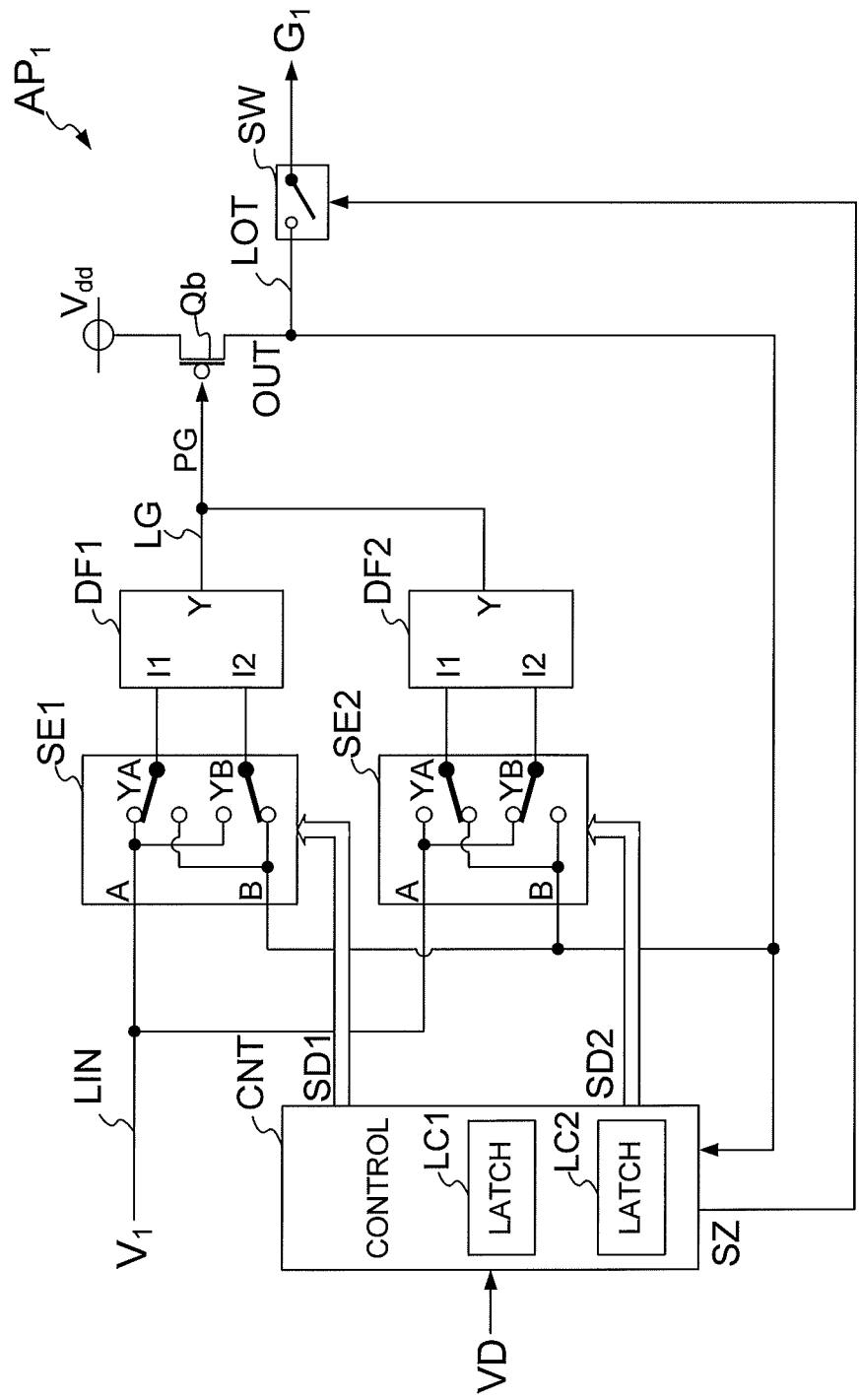
FIG. 4 is a circuit diagram illustrating a configuration of an amplifier $AP_1$.

FIG. 4 is a circuit diagram illustrating an internal configuration of the amplifier $AP_1$ as the differential amplifier according to the present invention. As shown in FIG. 4, the amplifier $AP_1$ includes: connection switches SE1 and SE2; differential units DF1 and DF2; an output transistor Qb; an output switch SW; and a control unit CNT.

A first input terminal A of each of the connection switches SE1 and SE2 is connected to an input line LIN, and a second input terminal B of each of the connection switches SE1 and SE2 is connected to an output line LOT (which will be described later).

Figures 5, 6:
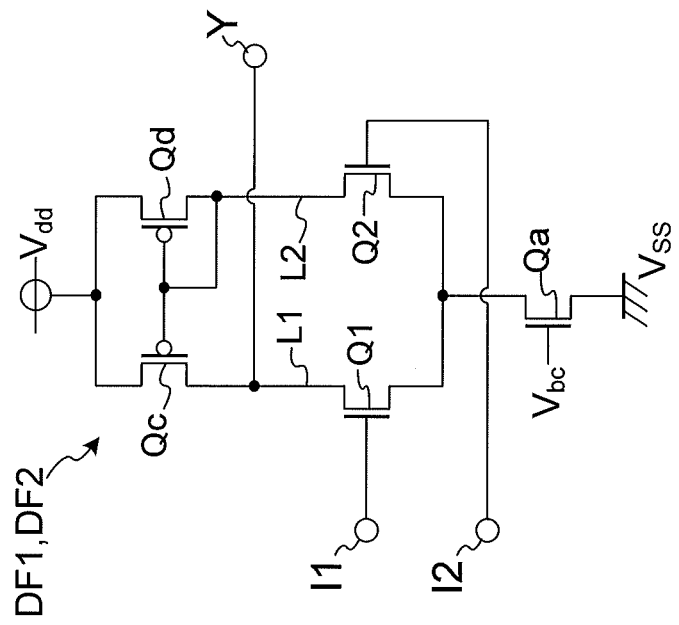
FIG. 5 is a table showing switching states in each of connection switches SE1 and SE2.
FIG. 6 is a circuit diagram illustrating an internal configuration of each of differential units DF1 and DF2.

When a connection setting signal SD1 supplied by the control unit CNT indicates [NORMAL] as shown in FIG. 5, the connection switch SE1 supplies the gradation voltage $V_1$ supplied via the input line LIN to a first input terminal I1 of the differential unit DF1 via an output terminal YA. Furthermore, the connection switch SE1 supplies an output voltage OUT supplied via the output line LOT to a second input terminal I2 of the differential unit DF1 via an output terminal YB.

When the connection setting signal SD1 indicates [OFFSET DETECTION] as shown in FIG. 5, the connection switch SE1 supplies the above gradation voltage $V_1$ to the input terminals I1 and I2 of the differential unit DF1 via the output terminals YA and YB, respectively.

When the connection setting signal SD1 indicates [CHOPPING] as shown in FIG. 5, the connection switch SE1 supplies the above gradation voltage $V_1$ to the second input terminal I2 of the differential unit DF1 via the output terminal YB. Furthermore, the connection switch SE1 supplies the above output voltage OUT to the first input terminal I1 of the differential unit DF1 via the output terminal YA.

When a connection setting signal SD2 supplied by the control unit CNT indicates [NORMAL] as shown in FIG. 5, the connection switch SE2 supplies the above gradation voltage $V_1$ to the first input terminal I1 of the differential unit DF2 via the output terminal YA. Furthermore, the connection switch SE2 supplies the above output voltage OUT to the second input terminal I2 of the differential unit DF2 via the output terminal YB.

When the connection setting signal SD2 indicates [OFFSET DETECTION] as shown in FIG. 5, the connection switch SE2 supplies the above gradation voltage $V_1$ to the input terminals I1 and I2 of the differential unit DF2 via the output terminals YA and YB, respectively.

When the connection setting signal SD2 indicates [CHOPPING] as shown in FIG. 5, the connection switch SE2 supplies the above gradation voltage $V_1$ to the second input terminal I2 of the differential unit DF2 via the output terminal YB. Furthermore, the connection switch SE2 supplies the above output voltage OUT to the first input terminal I1 of the differential unit DF2 via the output terminal YA.

The differential units DF1 and DF2 have the same internal configuration, for example, an internal configuration shown in FIG. 6.

As shown in FIG. 6, each of the differential units DF1 and DF2 includes: n-channel MOS (Metal-Oxide-Semiconductor) transistors Q1, Q2, and Qa; and p-channel MOS transistors Qc and Qd.

A source terminal of each of the transistors Q1 and Q2 together constituting a differential pair is connected to a drain terminal of the transistor Qa functioning as a current source. A gate terminal of the transistor Qa is applied with a bias voltage Vbc for driving the differential unit, and a source terminal thereof is applied with a ground voltage Vss (0 volt, for example).

A drain terminal of the transistor Q1 is connected to a drain terminal of the transistor Qc and an output terminal Y via a line L1. A drain terminal of the transistor Q2 is connected to a gate terminal of the transistor Qc, and a drain terminal and a gate terminal of the transistor Qd via a line L2. A source terminal of each of the transistors Qc and Qd is applied with a power-supply voltage Vdd.

A gate terminal of the transistor Q1 (one of the differential pair) is connected to the first input terminal I1, and a gate terminal of the transistor Q2 (the other one of the differential pair) is connected to the second input terminal I2.

Here, the transistor Q1 flows a current $I_1$, corresponding to a voltage supplied via the input terminal I1, through the line L1. The transistor Q2 flows a current $I_2$, corresponding to a voltage supplied via the input terminal I2, through the line L2. At this time, the transistor Qa functioning as a current source generates a current $I_0$, which is a resultant current of the current $I_1$ flowing through the line L1 and the current $I_2$ flowing through the line L2, on the basis of the bias voltage Vbc. Thus, the transistors Q1 and Q2 flow the currents $I_1$ and $I_2$ through the lines L1 and L2, respectively, so as to satisfy the relationship of $I_0 = I_1 + I_2$.

With the above configuration, each of the differential units DF1 and DF2 generates a voltage value corresponding to a difference value between the voltage supplied via the input terminal I1 and the voltage supplied via the input terminal I2 on the line L1.

The lines L1 in the differential units DF1 and DF2, each configured by the above configuration, are both connected to a drive line LG via the output terminals Y. The voltages generated on the respective lines L1 in the differential units DF1 and DF2 are added on the drive line LG. An output voltage driving signal PG having this added voltage value is supplied to a gate terminal of the p-channel MOS transistor Qb functioning as an output transistor.

A source terminal of the transistor Qb is applied with the power-supply voltage Vdd, and a drain terminal thereof is connected to the output line LOT. The transistor Qb sends out an output current based on the output voltage driving signal PG supplied to the gate terminal thereof to the output line LOT. As a result, the output voltage OUT having a voltage value corresponding to the output current sent out by the transistor Qb is generated on the output line LOT. The output voltage OUT is supplied to the input terminal B of each of the connection switches SE1 and SE2, the control unit CNT, and the output switch SW via the output line LOT.

The output switch SW is set to an OFF state when an output switch signal SZ supplied by the control unit CNT indicates SWITCH-OFF. When the output switch signal SZ indicating SWITCH-ON is supplied, on the other hand, the output switch SW is set to an ON state. When the output switch SW is in the ON state, the output line LOT is electrically connected to the data line $D_1$, serving as a load, in the display device 20 to supply the above output voltage OUT to the data line $D_1$ as the pixel driving voltage $G_1$. In the OFF state, on the other hand, the output switch SW breaks the electrical connection between the output line LOT and the data line $D_1$. As a result, the data line $D_1$ is set in a high-impedance state.

The control unit CNT includes: a latch LC1 for holding first offset information F1 (which will be described later) indicating an offset value in the differential unit DF1; and a latch LC2 for holding second offset information F2 (which will be described later) indicating an offset value in the differential unit DF2.

Figures 7, 8:
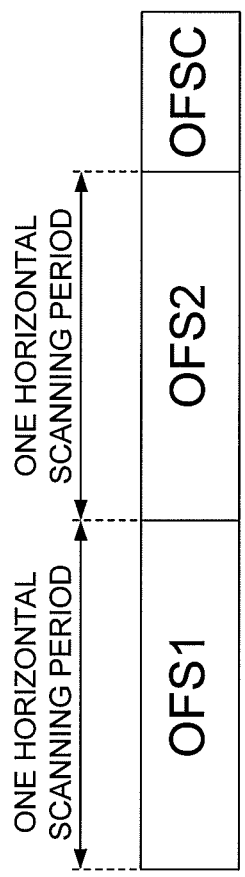
FIG. 7 is a chart illustrating processing (OFS1, OFS2, and OFSC) performed by a control unit CNT.
FIG. 8 is a table showing control details in each of OFS1, OFS2, and OFSC.

The control unit CNT sequentially performs first offset detection processing OFS1, second offset detection processing OFS2, and offset cancelation processing OFSC shown in FIG. 7 in the blank period BP provided between frames adjacent to each other in the video data signal VD shown in FIG. 2.

First, in the first offset detection processing OFS1, the control unit CNT supplies the output switch signal SZ indicating SWITCH-OFF to the output switch SW as shown in FIG. 8. Furthermore, in the first offset detection processing OFS1, the control unit CNT supplies the connection setting signal SD1 indicating [OFFSET DETECTION] to the connection switch SE1 and supplies the connection setting signal SD2 indicating [NORMAL] to the connection switch SE2 as shown in FIG. 8.

Figure 9:
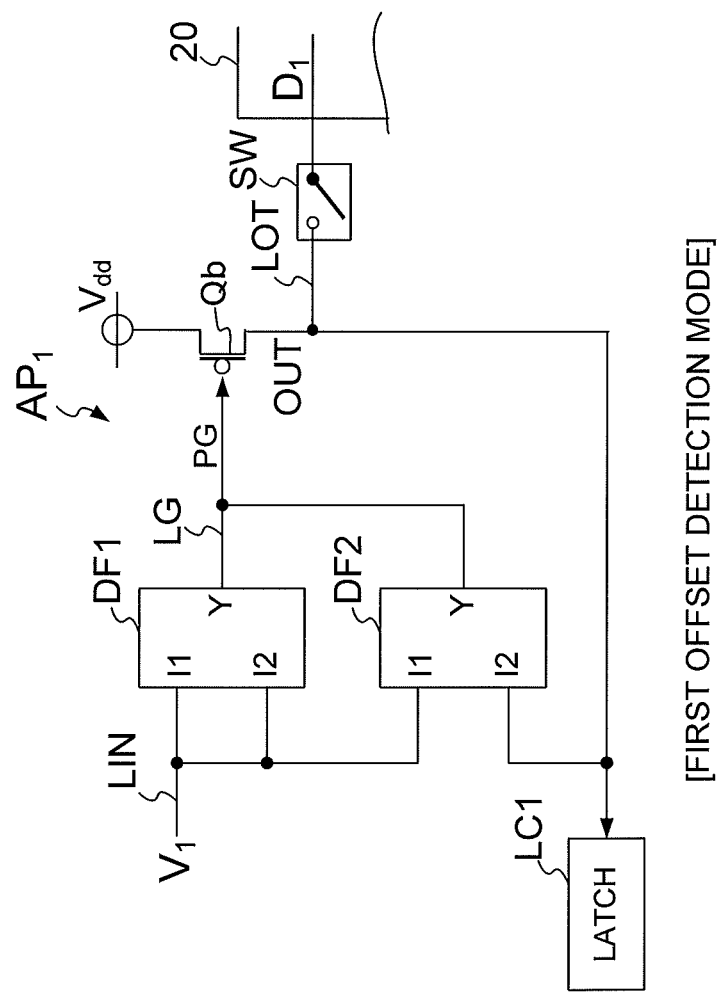
FIG. 9 is an equivalent circuit diagram in a first offset detection mode in the amplifier $AP_1$.

The above first offset detection processing OFS1 causes the amplifier $AP_1$ to be set in a connection state (first offset detection mode) as shown in FIG. 9 in an equivalent manner. In the first offset detection mode, the gradation voltage $V_1$ is supplied to both of the input terminals I1 and I2 of the differential unit DF1. As a result, the output value of the differential unit DF1 represents the offset value of the differential unit DF1. Thus, regardless of the output value of the differential unit DF2, a voltage corresponding to the offset value of the differential unit DF1 is generated on the drive line LG. Moreover, at this time, since the output line LOT of the amplifier $AP_1$ is electrically isolated from the data line $D_1$ of the display device 20 as shown in FIG. 9, the output voltage OUT reflecting the offset value of the differential unit DF1 is provided to the control unit CNT via the output line LOT. This causes the latch LC1 of the control unit CNT to take in the offset value of the differential unit DF1 represented by the output voltage OUT.

The control unit CNT performs the operation of the above first offset detection processing OFS1 over one horizontal scanning period. As a result, the offset value taken in into the latch LC1 immediately before the elapse of one horizontal scanning period is held in the latch LC1 as the first offset information F1.

Thus, the offset value of the differential unit DF1 is detected by the first offset detection processing OFS1.

After the first offset detection processing OFS1 is carried out, the control unit CNT successively performs the second offset detection processing OFS2 shown in FIG. 7.

In the second offset detection processing OFS2, the control unit CNT supplies the output switch signal SZ indicating SWITCH-OFF to the output switch SW as shown in FIG. 8. Furthermore, in the second offset detection processing OFS2, the control unit CNT supplies the connection setting signal SD1 indicating [NORMAL] to the connection switch SE1 and supplies the connection setting signal SD2 indicating [OFFSET DETECTION] to the connection switch SE2 as shown in FIG. 8.

Figure 10:
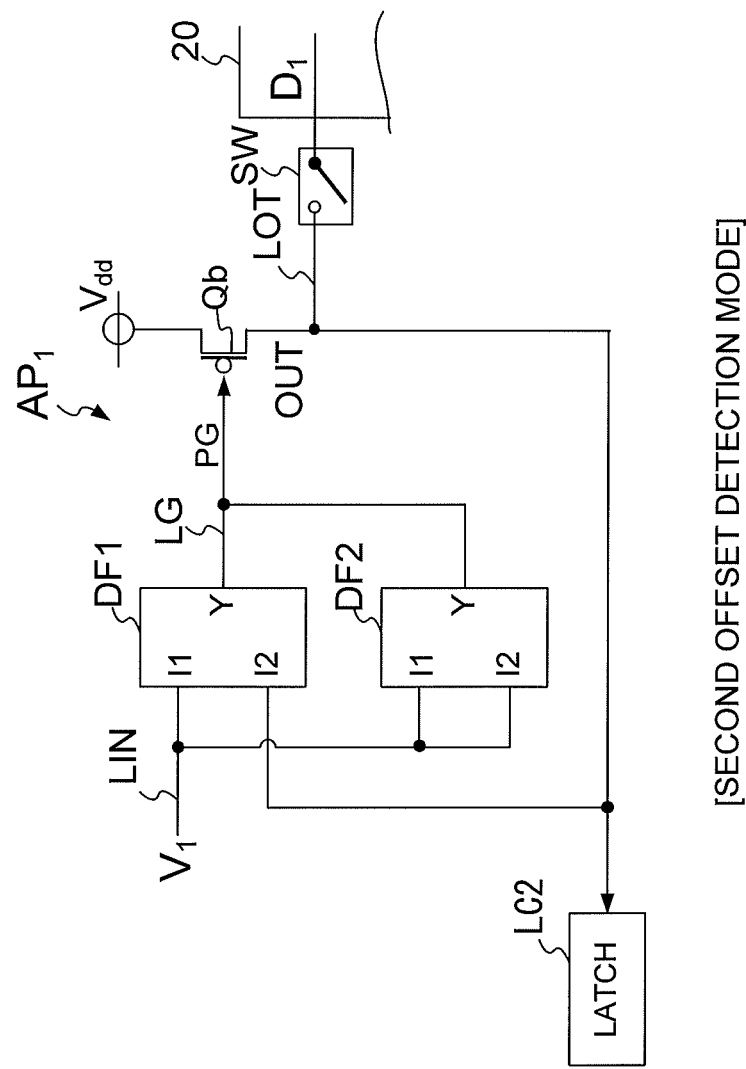
FIG. 10 is an equivalent circuit diagram in a second offset detection mode in the amplifier $AP_1$.

The above second offset detection processing OFS2 causes the amplifier $AP_1$ to be set in a connection state (second offset detection mode) as shown in FIG. 10 in an equivalent manner. In the second offset detection mode, the gradation voltage $V_1$ is supplied to both of the input terminals I1 and I2 of the differential unit DF2. As a result, the output value of the differential unit DF2 represents the offset value of the differential unit DF2. Thus, regardless of the output value of the differential unit DF1, a voltage corresponding to the offset value of the differential unit DF2 is generated on the drive line LG. Moreover, at this time, since the output line LOT of the amplifier $AP_1$ is electrically isolated from the data line $D_1$ of the display device 20 as shown in FIG. 10, the output voltage OUT reflecting the offset value of the differential unit DF2 is supplied to the control unit CNT via the output line LOT. This causes the latch LC2 of the control unit CNT to take in the offset value of the differential unit DF2 represented by the output voltage OUT.

The control unit CNT performs the operation of the above second offset detection processing OFS2 over one horizontal scanning period. As a result, the offset value taken in into the latch LC2 immediately before the elapse of one horizontal scanning period is held in the latch LC2 as the second offset information F2.

Thus, the offset value of the differential unit DF2 is detected by the second offset detection processing OFS2.

After the second offset detection processing OFS2 is carried out, the control unit CNT successively performs the offset cancelation processing OFSC shown in FIG. 7.

In the offset cancelation processing OFSC, the control unit CNT supplies the output switch signal SZ indicating SWITCH-ON to the output switch SW as shown in FIG. 8. Furthermore, in the offset cancelation processing OFSC, the control unit CNT supplies the connection setting signal SD1 indicating [NORMAL] to the connection switch SE1 as shown in FIG. 8.

In the offset cancelation processing OFSC, the control unit CNT determines the content of the connection setting signal SD2 on the basis of the offset information F1 and F2 held in the latches LC1 and LC2.

Figure 11:
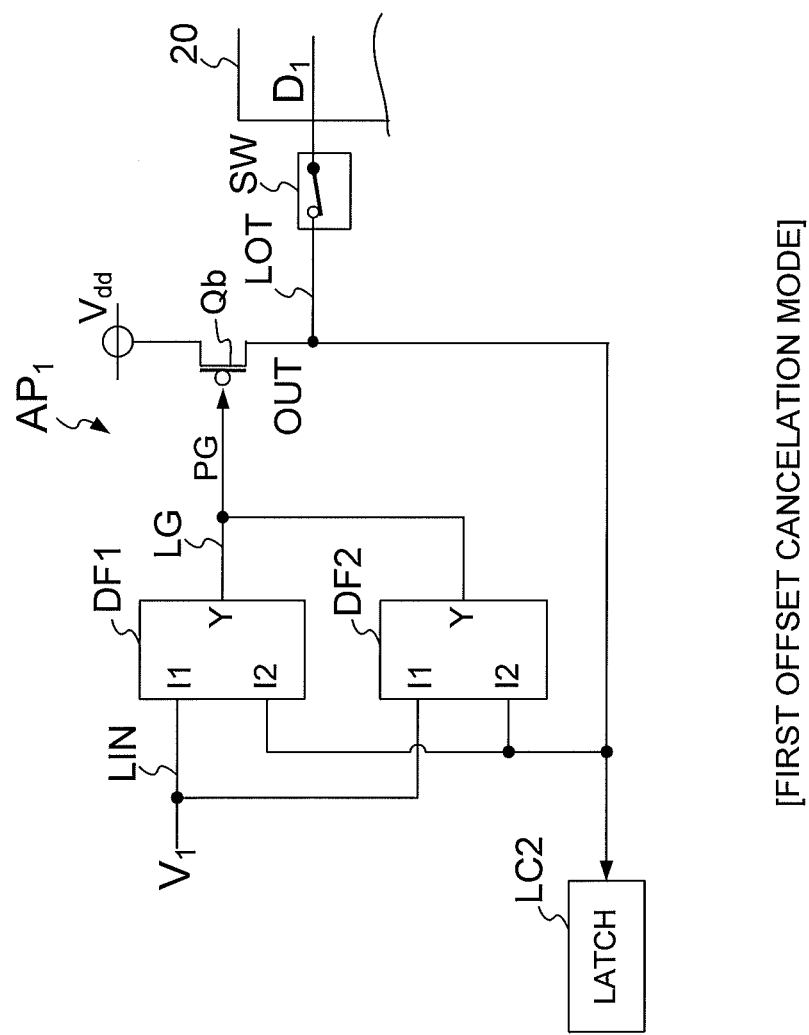
FIG. 11 is an equivalent circuit diagram in a first offset cancelation mode in the amplifier $AP_1$.

More specifically, when the offset values of the differential units DF1 and DF2 indicated by the offset information F1 and F2 have polarities different from each other, the control unit CNT supplies the connection setting signal SD2 indicating [NORMAL] to the connection switch SE2 as shown in FIG. 8. This sets the amplifier $AP_1$ in a connection state (first offset cancelation mode) as shown in FIG. 11 in an equivalent manner.

In the first offset cancelation mode, the gradation voltage $V_1$ as an input voltage is supplied to the input terminal I1 of each of the differential units DF1 and DF2, and the output voltage OUT is supplied to the input terminal I2 of each of the differential units DF1 and DF2. As a result, the differential units DF1 and DF2 each function as a voltage follower. The sum of the output values of these differential units DF1 and DF2 is supplied to the gate terminal of the transistor Qb as the output voltage driving signal PG.

The condition for performing the first offset cancelation mode is that the polarities of the offset values of the differential units DF1 and DF2, detected by the offset detection processing (OFS1 and OFS2) performed immediately therebefore, are different from each other.

Thus, according to the first offset cancelation mode, the addition of the output values of the differential units DF1 and DF2 causes part of the respectively-generated offsets to be canceled out, thereby reducing the offset amount correspondingly, i.e., achieving offset cancelation.

When the offset values of the differential units DF1 and DF2 represented by the offset information F1 and F2 have the same polarity, on the other hand, the control unit CNT supplies the connection setting signal SD2 indicating [CHOPPING] to the connection switch SE2 as shown in FIG. 8. This sets the amplifier $AP_1$ in a connection state (second offset cancelation mode) as shown in FIG. 12 in an equivalent manner.

In the second offset cancelation mode, the gradation voltage $V_1$ as an input voltage is supplied to the input terminal I1 of the differential unit DF1, and the output voltage OUT is supplied to the input terminal I2 of the differential unit DF1. On the other hand, the output voltage OUT is supplied to the input terminal I1 of the differential unit DF2, and the gradation voltage $V_1$ as an input voltage is supplied to the input terminal I2 of the differential unit DF2.

In other words, for the differential unit DF2, the output voltage OUT is supplied to the input terminal I1 instead of the gradation voltage $V_1$ having been supplied to the input terminal I1 until immediately therebefore, and the gradation voltage $V_1$ is supplied to the input terminal I2 instead of the output voltage OUT having been supplied to the input terminal I2 until immediately therebefore. In sum, according to the second offset cancelation mode, the voltages having been supplied to the input terminals I1 and I2 at a stage immediately before the offset detection processing (OFS1 and OFS2) are interchanged with each other for the differential unit DF2. This causes the differential units DF1 and DF2 to operate each as a voltage follower. The sum of the output values of these differential units DF1 and DF2 is supplied to the gate terminal of the transistor Qb as the output voltage driving signal PG.

The condition for performing the second offset cancelation mode is that the offsets of the differential units DF1 and DF2, detected by the offset detection processing (OFS1 and OFS2) performed immediately therebefore, have the same polarity. Therefore, the addition of the output values of the differential units DF1 and DF2 in such a state leads to an increase in total offset amount. In view of this, in the second offset cancelation mode, the voltages having been supplied to the input terminals I1 and I2 are interchanged with each other for the differential unit DF2 of the differential units DF1 and DF2. Consequently, the offset polarity in the differential unit DF2 is forced to be different from the offset polarity in the differential unit DF1.

Thus, according to the second offset cancelation mode, the addition of the output values of the differential units DF1 and DF2 causes part of the respectively-generated offsets to be canceled out, thereby reducing the offset amount correspondingly, i.e., achieving offset cancelation.

As described above, the amplifier $AP_1$ as a differential amplifier according to the present invention includes: the first and second differential units (DF1 and DF2); the drive line (LG); the output transistor (Qb); the first connection switch (SE1); the second connection switch (SE2); and the control unit (CNT) as shown in FIG. 4. Each of the first and second differential units generates a voltage corresponding to a difference value between the voltage provided to the first input terminal (I1) and the voltage provided to the second input terminal (I2) on the first line (L1). The output transistor generates an output voltage on the basis of a voltage on the drive line connected to the first line of each of the first and second differential units. The first connection switch performs either one of a normal connection state in which the input voltage ($V_1$) is supplied to the first input terminal of the first differential unit and the output voltage is supplied to the second input terminal of the first differential unit and an offset detection connection state in which the input voltage is supplied to the first and second input terminals of the first differential unit. The second connection switch performs any one of a normal connection state in which the input voltage is supplied to the first input terminal of the second differential unit and the output voltage is supplied to the second input terminal of the second differential unit, an offset detection connection state in which the input voltage is supplied to the first and second input terminals of the second differential unit, and a chopping connection state in which the input voltage is supplied to the second input terminal of the second differential unit and the output voltage is supplied to the first input terminal of the second differential unit.

The control unit first performs the first processing (OFS1) to determine the output voltage obtained when the first connection switch is set to the offset detection connection state as a first offset value. Next, the control unit performs the second processing (OFS2) to determine the output voltage obtained when the second connection switch is set to the offset detection connection state as a second offset value. The control unit then performs the third processing (OFSC) to set the first and second connection switches to the normal connection state when the first and second offset values have polarities different from each other, and set the first connection switch to the normal connection state and set the second connection switch to the chopping connection state when the first and second offset values have the same polarity.

Thus, according to such a configuration, connection switching is automatically performed so that the offset polarities of the first and second differential units are set to be different from each other. Therefore, an output voltage having undergone the offset cancelation can be obtained by connecting the outputs of the first and second differential units to each other. Thus, the employment of the differential amplifier shown in FIG. 4 as an amplifier for a display driver can mitigate deterioration in image quality due to offsets as compared to the employment of the conventional amplifier in which an output voltage including a positive offset and an output voltage including a negative offset are alternately output.

Although each amplifier AP includes the control unit CNT in the above embodiment, a control unit CNT may be provided outside the amplifier AP and the single control unit CNT may separately control the plurality of amplifiers AP. More specifically, the control unit CNT is omitted from each of the amplifiers $AP_1$ to $AP_n$, provided in the data driver 13, and the control unit CNT is formed in a region other than the amplifiers $AP_1$ to $AP_n$, in the data driver 13. Then, the control unit CNT sequentially performs the above first offset detection processing OFS1, second offset detection processing OFS2, and offset cancelation processing OFSC on each of the amplifiers $AP_1$ to $AP_n$.

This achieves reduction in device size of the data driver 13 as compared to the configuration in which the control unit CNT is provided in each of the amplifiers $AP_1$ to $AP_n$.

Moreover, the latch LC1 (LC2) holds the offset value of the differential unit DF1 (DF2) represented by the output voltage OUT as the offset information F1 (F2) in the above embodiment. Alternatively, the latch LC1 (LC2) may hold information indicating the polarity of the offset value as the offset information F1 (F2). For example, the latch LC1 (LC2) may hold the offset information F1 (F2) having a logic level 0 (or 1) if the offset value has the negative polarity and having a logic level 1 (or 0) if the offset value has the positive polarity. According to such a configuration, a 1-bit latch can be employed as the latch LC1 (LC2), thereby making it possible to reduce its device size as compared to the case where the offset value itself is held.

Moreover, the control unit CNT performs the first offset detection processing OFS1, the second offset detection processing OFS2, and the offset cancelation processing OFSC shown in FIG. 7 every blank period BP shown in FIG. 2, i.e., every frame period in the above embodiment. However, the series of processing OFS1, OFS2, and OFSC is not necessarily required to be performed every frame period. In sum, the series of processing OFS1, OFS2, and OFSC may be performed every predetermined offset processing period.

Alternatively, the series of processing OFS1, OFS2, and OFSC may be performed only immediately after power-on.

This application is based on Japanese Patent Application No. 2014-182026 which is herein incorporated by reference.

What is claimed is:

1. A differential amplifier for sending out an output voltage obtained by amplifying an input voltage via an output line, comprising:
    first and second differential units for respectively generating a voltage corresponding to a difference value between a voltage supplied to a first input terminal and a voltage supplied to a second input terminal on each of a first line;
    a drive line connected with both of the first line of the first differential unit and the first line of the second differential unit;
    an output transistor for generating the output voltage on the basis of a voltage on the drive line;
    a first connection switch for taking either one of a normal connection state in which the input voltage is supplied to the first input terminal of the first differential unit and the output voltage is supplied to the second input terminal of the first differential unit and an offset detection connection state in which the input voltage is supplied to the first and second input terminals of the first differential unit;
    a second connection switch for taking any one of a normal connection state in which the input voltage is supplied to the first input terminal of the second differential unit and the output voltage is supplied to the second input terminal of the second differential unit, an offset detection connection state in which the input voltage is supplied to the first and second input terminals of the second differential unit, and a chopping connection state in which the input voltage is supplied to the second input terminal of the second differential unit and the output voltage is supplied to the first input terminal of the second differential unit; and
    a control unit for performing first processing to determine the output voltage obtained when the first connection switch is set to the offset detection connection state as a first offset value, second processing to determine the output voltage obtained when the second connection switch is set to the offset detection connection state as a second offset value, and third processing to set the first and second connection switches to the normal connection state when the first and second offset values have polarities different from each other, and set the first connection switch to the normal connection state and set the second connection switch to the chopping connection state when the first and second offset values have the same polarity.

2. The differential amplifier according to claim 1, further comprising an output switch for electrically connecting the output line and a load in an ON state and breaking electrical connection between the output line and the load in an OFF state, and wherein
    the control unit sets the output switch to the OFF state only while performing the first processing and the second processing.

3. The differential amplifier according to claim 1, wherein the control unit includes: a first latch for holding information indicating a polarity of the first offset value; and a second latch for holding information indicating a polarity of the second offset value.

4. The differential amplifier according to claim 1, wherein the control unit sequentially performs the first processing, the second processing, and the third processing every predetermined offset processing period.

5. The differential amplifier according to claim 1, wherein the control unit sequentially performs the first processing, the second processing, and the third processing only immediately after power-on.

6. A display driver comprising a plurality of differential amplifiers that apply output voltages obtained by separately amplifying gradation voltages corresponding to luminance levels of pixels based on a video data signal to data lines of a display device, each of the differential amplifiers comprising:
    first and second differential units for respectively generating a voltage corresponding to a difference value between a voltage supplied to a first input terminal and a voltage supplied to a second input terminal on each of a first line;
    a drive line connected with both of the first line of the first differential unit and the first line of the second differential unit;
    an output transistor for generating the output voltage on the basis of a voltage on the drive line;

a first connection switch for taking either one of a normal connection state in which the gradation voltage is supplied to the first input terminal of the first differential unit and the output voltage is supplied to the second input terminal of the first differential unit and an offset detection connection state in which the gradation voltage is supplied to the first and second input terminals of the first differential unit;

a second connection switch for taking any one of a normal connection state in which the gradation voltage is supplied to the first input terminal of the second differential unit and the output voltage is supplied to the second input terminal of the second differential unit, an offset detection connection state in which the gradation voltage is supplied to the first and second input terminals of the second differential unit, and a chopping connection state in which the gradation voltage is supplied to the second input terminal of the second differential unit and the output voltage is supplied to the first input terminal of the second differential unit; and a control unit for performing first processing to determine the output voltage obtained when the first connection switch is set to the offset detection connection state as a first offset value, second processing to determine the output voltage obtained when the second connection switch is set to the offset detection connection state as a second offset value, and third processing to set the first and second connection switches to the normal connection state when the first and second offset values have polarities different from each other, and set the first connection switch to the normal connection state and set the second connection switch to the chopping connection state when the first and second offset values have the same polarity.

7. The display driver according to claim 6, comprising an output switch for electrically connecting the output line and the data line of the display device in an ON state and breaking electrical connection between the output line and the data line in an OFF state, and wherein the control unit sets the output switch to the OFF state only while performing the first processing and the second processing.

8. The display driver according to claim 6, wherein the control unit includes: a first latch for holding information indicating a polarity of the first offset value; and a second latch for holding information indicating a polarity of the second offset value.

9. The display driver according to claim 6, wherein every blank period provided between frames adjacent to each other in the video data signal, the control unit sequentially performs the first processing, the second processing, and the third processing within the blank period.

10. The display driver according to claim 6, wherein the control unit sequentially performs the first processing, the second processing, and the third processing only immediately after power-on.

11. A display driver comprising a plurality of differential amplifiers that apply output voltages obtained by separately amplifying gradation voltages corresponding to luminance levels of pixels based on a video data signal to data lines of a display device, each of the differential amplifiers comprising:

first and second differential units for respectively generating a voltage corresponding to a difference value between a voltage supplied to a first input terminal and a voltage supplied to a second input terminal on each of a first line;

a drive line connected with both of the first line of the first differential unit and the first line of the second differential unit;

an output transistor for generating the output voltage on the basis of a voltage on the drive line;

a first connection switch for taking either one of a normal connection state in which the gradation voltage is supplied to the first input terminal of the first differential unit and the output voltage is supplied to the second input terminal of the first differential unit and an offset detection connection state in which the gradation voltage is supplied to the first and second input terminals of the first differential unit; and a second connection switch for taking any one of a normal connection state in which the gradation voltage is supplied to the first input terminal of the second differential unit and the output voltage is supplied to the second input terminal of the second differential unit, an offset detection connection state in which the gradation voltage is supplied to the first and second input terminals of the second differential unit, and a chopping connection state in which the gradation voltage is supplied to the second input terminal of the second differential unit and the output voltage is supplied to the first input terminal of the second differential unit, wherein the display driver further comprises a control unit for performing, for each of the differential amplifiers, first processing to determine the output voltage obtained when the first connection switch is set to the offset detection connection is determined as a first offset value, second processing to determine the output voltage obtained when the second connection switch is set to the offset detection connection state as a second offset value, and third processing to set the first and second connection switches to the normal connection state when the first and second offset values have polarities different from each other, and set the first connection switch to the normal connection state and set the second connection switch to the chopping connection state when the first and second offset values have the same polarity.

12. The display driver according to claim 11, wherein each of the differential amplifiers comprises an output switch for electrically connecting the output line and the data line of the display device in an ON state and breaking electrical connection between the output line and the data line in an OFF state, and the control unit sets the output switch to the OFF state only while performing the first processing and the second processing.

13. The display driver according to claim 11, wherein the control unit includes: a first latch for holding information indicating a polarity of the first offset value; and a second latch for holding information indicating a polarity of the second offset value.

14. The display driver according to claim 11, wherein every blank period provided between frames adjacent to each other in the video data signal, the control unit sequentially performs the first processing, the second processing, and the third processing within the blank period.

15. The display driver according to claim 11, wherein the control unit sequentially performs the first processing, the second processing, and the third processing only immediately after power-on.

* * * * *